(12) United States Patent
Seki

(10) Patent No.: US 7,075,118 B2
(45) Date of Patent: Jul. 11, 2006

(54) LIGHT SOURCE UNIT AND PROJECTOR

(75) Inventor: Hideya Seki, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/999,934

(22) Filed: Dec. 1, 2004

(65) Prior Publication Data

US 2005/0139854 A1    Jun. 30, 2005

(30) Foreign Application Priority Data

Dec. 25, 2003    (JP)    ............................. 2003-430004

(51) Int. Cl.
*H01L 31/00*    (2006.01)
(52) U.S. Cl. ........................... 257/100; 257/99; 257/98
(58) Field of Classification Search ................ 257/100, 257/98, 99
See application file for complete search history.

(56) References Cited

U.S. PATENT DOCUMENTS

| 5,656,857 | A   | * | 8/1997  | Kishita ........................ 257/690 |
| 6,639,356 | B1  | * | 10/2003 | Chin .......................... 313/499  |
| 2004/0227149 | A1 | * | 11/2004 | Ibbetson et al. ............. 257/100 |
| 2005/0094397 | A1 | * | 5/2005  | Yamada et al. .............. 362/253 |

FOREIGN PATENT DOCUMENTS

| JP | U-49-053668   | 5/1974  |
| JP | U-49-112163   | 9/1974  |
| JP | U-56-123573   | 9/1981  |
| JP | A-56-142657   | 11/1981 |
| JP | A-61-042975   | 3/1986  |
| JP | A-01-179483   | 7/1989  |
| JP | A-11-298048   | 10/1999 |
| JP | A-11-340515   | 12/1999 |
| JP | A-2001-036149 | 2/2001  |
| JP | A-2001-267670 | 9/2001  |
| JP | A-2002-244211 | 8/2002  |

* cited by examiner

*Primary Examiner*—Minhloan Tran
*Assistant Examiner*—Eduardo A. Rodela
(74) *Attorney, Agent, or Firm*—Oliff & Berridge, PLC

(57) ABSTRACT

Exemplary embodiments provide a light source unit capable of reducing emission of any unnecessary electromagnetic waves to a sufficient level, and a projector using such a light source unit. Exemplary embodiments include a chip that emits light responding to an incoming current, a base section structured by stacking the chip, electrode terminals to supply the current to the chip, and a cap section made from an optically transparent member to seal both the chip, and the electrode terminals, and a bonding wire. The base section and the cap section are both made from a conductive member, and the chip, the bonding wire, and the electrode terminals are electromagnetically enclosed through sealing by the base section and the cap section.

9 Claims, 4 Drawing Sheets

LIGHT SOURCE UNIT AND PROJECTOR

BACKGROUND OF THE INVENTION

1. Field of Invention

Exemplary embodiments of the present invention relate to a light source unit and a projector. More specifically, exemplary embodiments relate to a light source unit using a solid-state light emitting device.

2. Description of Related Art

A related art light source unit for a projector can use a discharging lamp, such as a metal halide lamp, a xenon lamp, an extra-high voltage mercury lamp, or devices. Such a discharging lamp is high in intensity and efficiency, but requires a high-voltage power supply circuit. The high-voltage power supply circuit is large in size and thus heavy, thereby preventing the projector from being reduced in size. Even more disadvantageous is the fact that the useful life of the discharging lamp is not long enough. Moreover, the discharging lamp has considerable difficulty in quick lighting-up and lighting-off, modulation, and the like. Especially, to turn on the discharge lamp, it takes a long time, such as several minutes, for example.

This is the reason why a light source unit using a solid-state light emitting device may be advantageous. A related art solid-state light emitting device includes a light emitting diode (hereinafter "LED"), which may become advantageous. In addition to a low-output LED for display, a high-output LED for illumination may be used. The LED has characteristics of being ultra-compact and ultra-light, and having a long life. In this sense, the LED is considered suitable for the use with a projector, specifically with a light source unit for a small-sized portable projector.

The LED has other characteristics of, through control of a drive current, without difficulty, quick lighting-up, lighting-off, and modulation (adjustment for the amount of light emission) of the order of a millisecond. By utilizing the high-speed drive of the LED, it becomes possible to sequentially lighten-up, for illumination, the LED for red light beams (hereinafter "Red light beams"), the LED for green light (hereinafter "Green light beams"), and the LED for blue light (hereinafter "Blue light beams") on a video frame basis, for example. Further, by LED pulsed radiation and light-emitting time integration, there is the prospect of larger output. Another prospect is that, as a result of LED pulsed radiation, a so-called tailing phenomenon can be reduced, causing image afterglow looking as if moving images displayed on a screen have tails.

In a case of using LEDs as a light source of a projector, to ensure the sufficient level of intensity, a large current, of about 1 ampere for every LED, must be supplied. If such a large current is supplied to the LEDs with the above-described high-speed drive, it may generate strong electromagnetic waves from a current line that is provided for current supply to the LEDs. If generated, the resulting electromagnetic waves from the current line are not needed for the projector. If the emitted electromagnetic waves are strong, this may result in malfunctions of the projector and its peripheral equipment, deleterious effects on health, and others. In view of this, it may be advantageous to provide constraints of product electromagnetic compatibility to reduce or prevent generation of any unnecessary electromagnetic waves. A related art technology of reducing such unnecessary electromagnetic waves in light emitting devices is disclosed in JP-A-11-340515.

SUMMARY OF THE INVENTION

With the structure disclosed in JP-A-11-340515, the surface of an LED from which light beams are emitted is not electromagnetically shielded. Therefore, the technology disclosed in JP-A-11-340515 has difficulty in reducing electromagnetic waves coming from light-emitting systems to a sufficient level. To put a projector into practical use, a structure that is capable of reducing any outgoing electromagnetic waves to a sufficient level, and ensuring the electromagnetic compatibility, is required. Exemplary embodiments of the present invention address the above and/or other circumstances, and provide a light source unit capable of reducing any unnecessary electromagnetic waves to a sufficient emission level, and a projector for use with such a light source unit.

In order to address or solve the above, an exemplary embodiment of the present invention provides a light source unit including a chip that emits light responding to an incoming current, a base section structured by stacking the chip, an electrode terminal to supply the current to the chip, and a cap section made from an optically transparent member to seal both the chip and the electrode terminal. In the light source unit, at least the chip and the electrode terminal are electromagnetically enclosed by a conductive member.

In response to the light emission of the chip, the solid-state light emitting device is supposed to generate any unnecessary electromagnetic waves from the chip and an electrode terminal provided for current supply to the chip. In an exemplary embodiment of the present invention, a conductive member is used to shield both the chip and the electrode terminal. By shielding the chip and the electrode terminal using a conductive member as such, electromagnetic waves if unnecessarily generated by the chip and the electrode terminal are trapped in the conductive member through reflection and absorption. Such electromagnetic waves are then partially converted into Joule heat by resistance on the surface of the conductive member. Alternatively, by the conductive member, such electromagnetic waves may be converted into currents to pass the resulting currents to outside of the light source unit. Such currents passed to the outside of the light source unit as a result of conversion from the electromagnetic waves are also converted into Joule heat eventually by the resistance. In such a manner, any electromagnetic waves to be unnecessarily generated in response to the light emission of the chip are converted into heat or current. Through shielding by the conductive member, the chip and the electrode terminal are electromagnetically enclosed. As a result, a light source unit is provided that is capable of sufficiently reducing the emission of any unnecessarily-generated electromagnetic waves.

Moreover, as an exemplary aspect of the present invention, desirably, at least a part of the base section and the cap section may be made from the conductive member, and at least the chip and the electrode terminal may be sealed by at least the part of the base section and the cap section. The cap section is made from a member that is optically transparent, and provided to seal the chip and the electrode terminal. If a conductive member is used to structure the base section and the cap section, the resulting base section and the cap section become able to electromagnetically enclose both the chip and the electrode terminal. Even more advantageously, since the cap section is an optically transparent member, a capability is provided of leading the emitting light to the exterior of the light source unit, and a capability is provided of being a conductive member. Thereby, the chip and the electrode terminal can be both electromagnetically enclosed.

Further, as another exemplary aspect of the present invention, desirably, the cap section may have a light emitting side provided with an optically transparent surface member, at least a part of the base section and the surface member may be made from the conductive member, and at least the chip and the electrode terminal may be sealed by at least the part of the base section and the surface member. If a conductive member is used to structure the surface member of the cap section and the base section, the resulting base section and the surface member become able to electromagnetically enclose the chip and the electrode terminal. Even more advantageously, since the surface member is optically transparent, it may not be an obstacle for the emitting light to emit. Thereby, the chip and the electrode terminal can be both electromagnetically enclosed.

Still further, as still another exemplary aspect of the present invention, desirably, an optically transparent liquid member may be provided between the chip and the cap section, at least a part of the base section and the liquid member may be made from the conductive member, and at least the chip and the electrode terminal may be sealed by at least the part of the base section and the liquid member. If a conductive member is used to structure the base section and the liquid member, the resulting base section and the liquid member become able to electromagnetically enclose the chip and the electrode terminal. Even more advantageously, since the liquid member is optically transparent, it may not be an obstacle for the emitting light to emit. Thereby, the chip and the electrode terminal can be both electromagnetically enclosed.

Still further, as still another exemplary aspect of the present invention, desirably, the electrode terminal may be doubly provided, and either of the two electrode terminals may establish an electrical connection with the conductive member. As such, once either of the two electrode terminals is electrically connected to the conductive member, any unnecessary electromagnetic waves can be converted into currents by the conductive member, and then the resulting currents can be passed to the exterior of the light source unit. If this is the case, alternatively, the currents as a result of conversion from the unnecessary electromagnetic waves may be passed to a ground electrode. Herein, to pass the currents as a result of conversion from the unnecessary electromagnetic waves to the ground electrode, there is no need to newly include a terminal in addition to the two electrode terminals. Thereby, with a simple structure, the currents as a result of conversion from any unnecessary electromagnetic waves can be passed to the exterior of the light source unit.

Still further, as still another exemplary aspect of the present invention, desirably, the conductive member may be provided to protrude outside. By establishing a connection between the conductive member and any another member exemplarily connected to a ground electrode, the currents as a result of conversion from the unnecessary electromagnetic waves can be passed to the exterior. In such a case, if the conductive member is protruding outside of the light source unit, the conductive member and the other member can be connected together with ease at low impedance. With such a structure, the currents as a result of conversion from the unnecessary electromagnetic waves can be passed to the exterior of the light source unit with a high degree of efficiency.

Still further, as still another exemplary aspect of the present invention, desirably, when electromagnetic waves of a predetermined frequency are generated responsively when the chip emits light, the conductive member may be positioned to have a spatial space with another conductive member equal to one twentieth of a wavelength of the electromagnetic waves or shorter. Considered here is an exemplary case of using a conductive member to structure both the base section and the cap section. The base section and the cap section are mechanically attached together by crimping, for example. If this is the case, the attachment part between the base section and the cap section may have a space. If a space is observed in the conductive member as such, the electromagnetic waves may leak from the space. If the conductive member is positioned to have a spatial space with another conductive member equal to one twentieth of the wavelength of the electromagnetic waves or shorter, such a structure will lead to leakage reduction of the electromagnetic waves from the space. As such, even if there is a difficulty in closely attaching the conductive members, the electromagnetic waves can be prevented from leaking or such leakage can be reduced through reinforcement of electromagnetic enclosure strength between the chip and the electrode terminal.

Still further, as still another exemplary aspect of the present invention, desirably, the conductive member may be electrically connected to a ground electrode. Through connection between the conductive member and the ground electrode, it becomes possible to pass currents as a result of conversion from the electromagnetic waves to the exterior of the light source unit. The currents thus passed to the ground electrode are converted into Joule heat. In this manner, the emission of any unnecessary electromagnetic waves can be reduced by passing the currents as a result of conversion from the electromagnetic waves to the exterior of the light source unit.

Moreover, according to an exemplary aspect of the present invention, a projector is provided that includes a light source unit to supply light beams, a spatial light modulator to modulate the light beams coming from the light source unit in accordance with a picture signal, and a projection lens to project the light beams from the spatial light modulator. In the projector, the light source unit is the above-described light source unit. By using such a light source unit, any unnecessary electromagnetic waves can be reduced to a sufficient level. As a result, a projector is provided that is capable of sufficiently reducing the generation of any unnecessary electromagnetic waves.

DETAILED DESCRIPTION OF PREFERRED EMBODIMENTS

In the below, exemplary embodiments of the present invention are described in detail by referring to the accompanying drawings.

[First Exemplary Embodiment]

Figure 1:
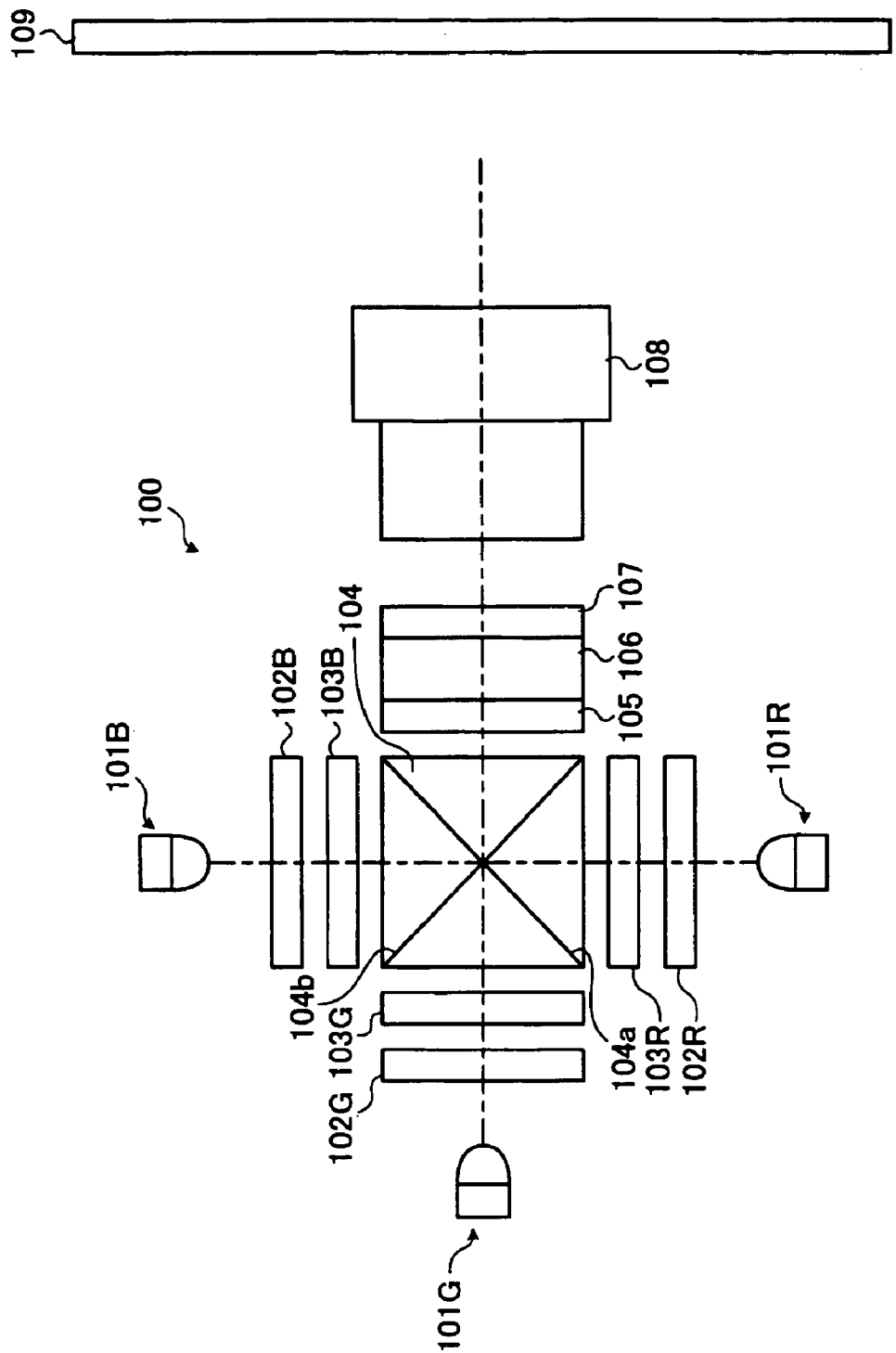
FIG. 1 is a schematic showing the structure of a projector of a first exemplary embodiment of the present invention.

FIG. 1 is a schematic showing the structure of a projector 100 of a first exemplary embodiment of the present invention. In the present exemplary embodiment, described first is the schematic structure of the projector 100 in its entirety, and then the structure of a light source unit. The projector 100 includes a Red LED 101R that is a light source unit for Red light beams, a Green LED 101G that is a light source unit for Green light beams, and a Blue LED 101B that is a light source unit for Blue light beams.

The Red light beams from the Red LED 101R pass through λ/4 phase plate 102R, and enter a reflective polarizing plate 103R. The reflective polarizing plate 103R passes through polarized light beams in a specific oscillation direction, e.g., p polarized light beams, and reflects polarized light beams in an oscillation direction different from the specific oscillation direction, e.g., s polarized light beams. The p polarized light beams passed through the reflective polarizing plate 103R enter a cross-dichroic prism 104. The light beams reflected by the reflective polarizing plate 103R are directed in the opposite direction on the optical path substantially the same as the one for entering the reflective polarizing plate 103R. Out of the light beams reflected by the reflective polarizing plate 103R, the s polarized light beams are converted into circular polarized beams by passing through the λ/4 phase plate 102R. The light beams passed through the λ/4 phase plate 102R are directed back to the Red LED 101R.

The light beams thus put back to the Red LED 101R are reflected by a chip or other devices provided to the Red LED 101R, and then become circular polarized light beams in the reverse rotation direction, heading toward the λ/4 phase plate 102R again. Thereafter, the circular polarized light beams thus entered the λ/4 phase plate 102R are converted into the p polarized light beams this time. The resulting p polarized light beams coming from the λ/4 phase plate 102R enter the cross-dichroic prism 104 after passing through the reflected polarizing plate 103R. In such a manner, the cross-dichroic prism 104 receives the Red light beams as a result of conversion into the p polarized light beams.

In the similar manner to the Red light beams, Green light beams from the Green LED 101G and Blue light beams from the Blue LED 101B are converted into polarized light beams in a specific oscillation direction, e.g., p polarized light beams, and then enter the cross-dichroic prism 104. The cross-dichroic prism 104 has such a structure that two dichroic films 104a and 104b are placed to be orthogonal to each other in an X shape. The dichroic film 104a reflects the Red light beams, and passes through the Blue and Green light beams. The dichroic film 104b reflects the Blue light beams, and passes through the Red and Green light beams. As such, the cross-dichroic prism 104 combines the Red, Green, and Blue light beams.

A transparent liquid crystal display unit 106 serving as a spatial light modulator includes polarizing plates 105 and 107. The polarizing plate 105 is provided on the light-entering side of the liquid crystal display unit 106. The polarizing plate 107 is provided on the light-emitting side of the liquid crystal display unit 106. As described above, the Red, Green, and Blue light beams entering the cross-dichroic prism 104 are already converted into p polarized light beams, which are the polarized light beams directed in each specific oscillation direction. The Red, Green, and Blue light beams thus converted into the p polarized light beams enter the polarizing plate 105 as they are. The polarizing plate 105 passes through the p polarized light beams, and directs the results into the liquid crystal display unit 106. The p polarized light beams thus entered into the liquid crystal display unit 106 are then converted into s polarized light beams by modulation in accordance with a picture signal, and the results then head for the polarizing plate 107.

The polarizing plate 107 passes through the s polarized light beams, and directs the results toward a projection lens 108. The projection lens 108 projects, onto a screen 109, the light beams as a result of modulation by the liquid crystal display unit 106. By converting light beams entering the cross-dichroic prism 104 into p polarized light beams in a specific oscillation direction, the light beams to be absorbed by the polarizing plate 105 can be reduced, and the light beams to be provided to the liquid crystal display unit 106 can be increased. By increasing the light beams to be provided to the liquid crystal display unit 106 as such, the light beams coming from the LEDs 101R, 101G, and 101B provided for the respective colored light beams can be utilized with a high degree of efficiency.

Figure 2:
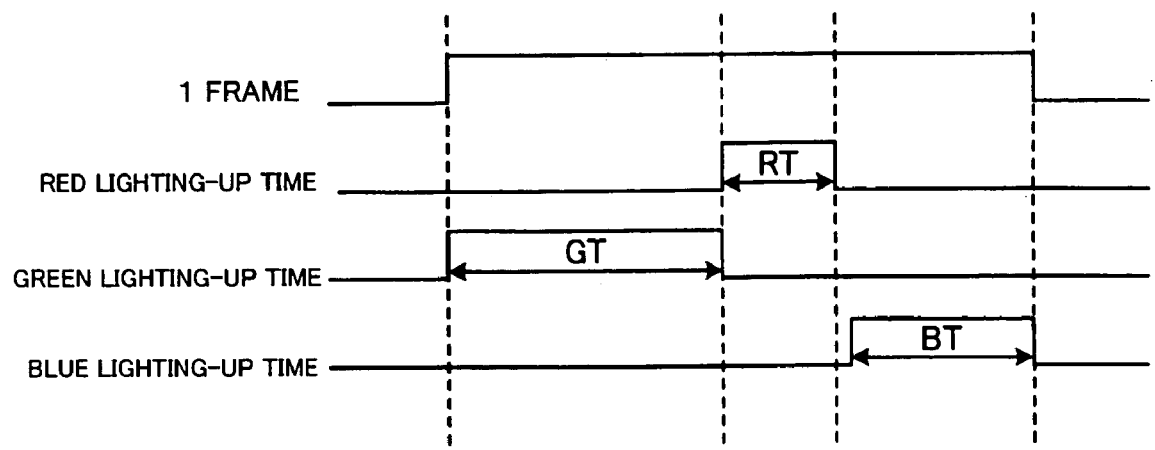
FIG. 2 is a schematic showing exemplary lighting-up time and lighting-up timing for LEDs for each colored light beams.

Described next are the lighting-up time and timing for the Red LED 101R, the Green LED 101G, and the Blue LED 101B. FIG. 2 shows an exemplary lighting-up time and timing for the Red LED 101R, the Green LED 101G, and the Blue LED 101B. As described above by referring to FIG. 1, the projector 100 uses a single liquid crystal display unit 106 to subject the respective colored light beams to light modulation. The liquid crystal display unit 106 sequentially performs light modulation with respect to each colored light beams in an image frame.

FIG. 2 shows that a frame is divided into a Red lighting-up time, a Green lighting-up time, and a Blue lighting-up time. In response to the light modulation performed by the liquid crystal display unit 106, the LEDs 101R, 101G, and 101B for the respective colored light beams are lightened-up on a color basis. The LED has characteristics of, through control of a drive current, without difficulty, quick lighting-up, lighting-out, modulation (adjustment for the amount of light emission) of the order of millisecond. Through utilization of such characteristics, for illumination, it becomes possible to sequentially lighten-up the LEDs for the respective colored light beams on a video frame basis. Accordingly, without the need for the structure, such as a color wheel, the sequential color drive is possible with a simple structure.

To derive a projection image appearing as white on the whole by projecting the Red, Green, and Blue light beams sequentially, it requires the Green light beams to cover 60 to 80% of the entire light beams. Assuming that the LEDs 101R, 101G, and 101B for the respective colored light beams are equal in output amount, it means that the Green light beams are not enough in quantity. Thus, as shown in FIG. 2, a lighting-up time GT for the Green LED 101G is set so as to be longer both than a lighting-up time RT for the Red LED 101R and a lighting-up time BT for the Blue LED 101B. Moreover, in the projector 100 of FIG. 1, an LED is provided for light beams on a color basis. This is not restrictive, and the LED may be plurally provided for light beams on a color basis. If the LED is plurally provided for light beams on a color basis, the Green LED 101G may be provided with more than the Red LED 101R and the Blue LED 101B so that the Green light beams are increased in quantity.

After pulsed radiation of the LEDs 101R, 101G, and 101B for the respective colored light beams, by light-emitting time integration, the resulting output will be larger than the one derived by the continuous light emission. Moreover, as a result of pulsed radiation of the LEDs 101R, 101G, and 101B for the respective colored light beams, a so-called tailing phenomenon can be reduced, causing image afterglow, i.e., looking as if moving images displayed on a screen have tails. As such, through high-speed LED drive, not only performing sequential color drive with a simple structure, the projector 100 becomes able to derive bright and high-quality images.

Figure 3:
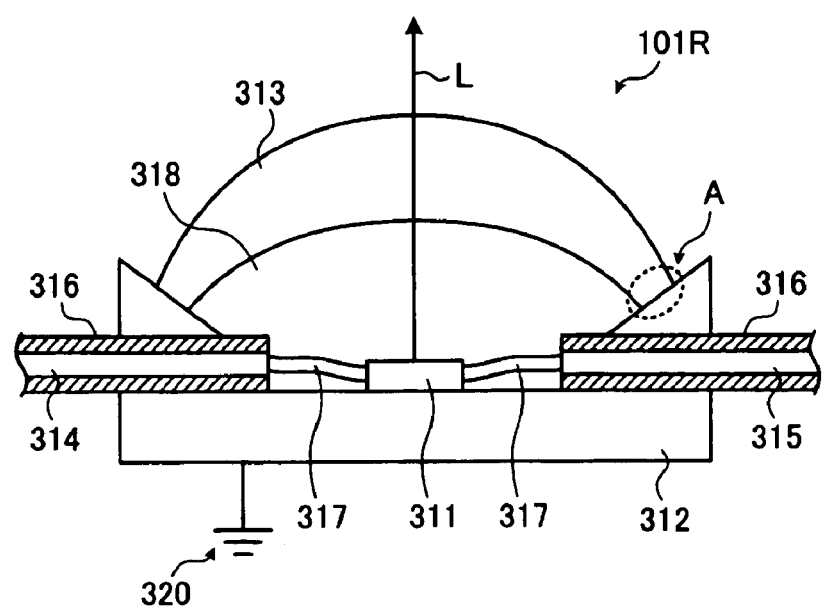
FIG. 3 is a cross-sectional view of a light source unit.

Described next is the structure of the LEDs 101R, 101G, and 101B, each serving as a light source unit for the respective colored light beams. In exemplary embodiments of the present invention, the LEDs 101R, 101G, and 101B for the respective colored light beams have the same structure for their characteristic parts. Accordingly, in the present exemplary embodiment and the following other exemplary embodiments, the structure of the Red LED is exemplified for description. FIG. 3 shows the cross sectional structure of the Red LED 101R. A chip 311 of the Red LED 101R emits light responding to current supply. The chip 311 is stacked on the surface of the base section 312. The base section 312 is made from a conductive member, e.g., metal member including aluminum, copper, or other materials.

The base section 312 is provided with a first electrode terminal 314 and a second electrode terminal 315. The electrode terminals 314 and 315 supply, to the chip 311, currents from an external power supply (not shown). The electrode terminals 314 and 315 are electrically connected to the chip 311 by a bonding wire 317, respectively. Alternatively, the electrode terminals 314 and 315 may be both directly connected to the chip 311 without using the bonding wire 317. In a case of directly connecting among the electrode terminals 314 and 315, and the chip 311, this eliminates the need for the bonding wire 317.

The electrode terminals 314 and 315 both carry an insulation layer 316 on their surfaces. The insulation layer 316 serves to electrically insulate among the electrode terminals 314 and 315, and the base section 312. The base section 312 is provided so as to protrude outside of the Red LED 101R, e.g., protrude below the Red LED 101R. An electrical connection is established between the part of the base section 312 protruding outside of the Red LED 101R, and a light source drive circuit that is not shown, for example. The base section 312 may be provided with a connection line to be electrically connected with the light source drive circuit. The light source drive circuit is electrically connected with the ground electrode 320 that is provided outside of the Red LED 101R. With such a structure, the base section 312 and the ground electrode 320 are electrically connected to each other via the light source drive circuit.

Instead of using a connection line between the base section 312 and the light source drive circuit, the base section 312 and the light source drive circuit may be placed so as to come in contact with each other, for example. Thereby, an electrical connection can be established between the base section 312 and the light source drive circuit. In such a case, the base section 312 may be embedded with an elastic and conductive member at a part contacting the light source drive circuit. Using such an elastic and conductive member can closely attach together the base section 312 and the light source drive circuit.

Further, the structure component to be connected with the base section 312 is not restricted to the light source drive circuit, and may be a heat sink, for example. The light source drive circuit, the heat sink, and other components are generally connected to the ground electrode 320, a common line, a power source line, or other devices. With such a structure, through connection with the light source drive circuit or devices, the base section 312 is electrically connected with the externally-provided ground electrode 320 or devices. Herein, the ground electrode 320 is not the only option for an electrical connection to the base section 312 via the light source drive circuit or other devices, and a common line, a power supply line, or other devices can also be used.

The Red LED 101R has a cap section 313 on the side of the chip 311 from which a light beam L is emitted. The cap section 313 is made from an optically transparent conductive member. As an example, the cap section 313 can be made from a member derived by adding a conductive substance to a transparent resin. The cap section 313 is attached to the base section 312. The cap section 313 seals the chip 311, the bonding wire 317, and the electrode terminals 314 and 315.

The base section 312 and the cap section 313 are mechanically attached together by crimping or using a conductive adhesive, for example. The base section 312 is not restrictively made from a conductive member in its entirety, and the base section 312 may be partially made from a conductive member. The base section 312 may be made from a member as a result of laminating a copper plate to a plastic substrate, or a member derived by evaporating an aluminum film. In a case where the base section 312 is partially made from a conductive member as such, the part of the base section 312 made from the conductive member and the cap section 313 can seal the chip 311, the bonding wire 317, and the electrode terminals 314 and 315.

The space between the cap section 313 and the base section 312 is filled with an optically transparent liquid member 318. The liquid member 318 includes silicon gel, for example. The liquid member 318 causes thermal convection responding to heat coming from the chip 311. By the liquid member 318 causing thermal convection, the Red LED 101R becomes able to release the heat from the chip 311 with a high degree of efficiency. Through combination, as appropriate, of the refractive characteristics of the liquid member 318 and the refractive characteristics of the cap section 313, the light beam L can be efficiently extracted to the exterior of the Red LED 101R.

In a case of using LEDs as a light source of the projector 100, to ensure the sufficient level of intensity, a large current, of about 1 ampere for every LED, must be supplied. If such a large current is supplied to the Red LED 101R with the above-described high-speed drive, it may generate strong electromagnetic waves from the chip 311, the bonding wire 317, and the electrode terminals 314 and 315 in response to the light emission. If generated, the resulting electromagnetic waves from the chip 311 or other devices are not needed for the projector 100. If the emitted electromagnetic waves are strong, this may result in malfunctions of projector 100 and its peripheral equipment, deleterious effects on health, and other effects. In view of this, to put the projector 100 into practical use, a structure must be provided that is capable of reducing the level of electromagnetic waves to be emitted from the projector 100, and ensuring the electromagnetic compatibility.

In the Red LED 101R, the chip 311, the bonding wire 317, and the electrode terminals 314 and 315 are all sealed by the base section 312 and the cap section 313, both of which are made from the conductive member. The base section 312 and the cap section 313 serve to trap inside, through reflection, any electromagnetic waves unnecessarily generated by the light emission of the chip 311. Such electromagnetic waves are then partially converted into Joule heat by resistance on the surfaces of the base section 312 and the cap section 313. The base section 312 and the cap section 313 also convert the electromagnetic waves to currents. The currents as a result of conversion from the electromagnetic waves by the base section 312 and the cap section 313 as such flow into the ground electrode 320. The currents that thereby flow into the ground electrode 320 are converted into Joule heat eventually by the resistance.

In such a manner, any electromagnetic waves to be unnecessarily generated in response to the light emission of the chip 311 are trapped inside of the base section 312 and the cap section 313, and then converted into heat or current. Through shielding enclosure by the base section 312 and the cap section 313, electromagnetic enclosure is completed for the chip 311, the bonding wire 317, and the electrode terminals 314 and 315. With such electromagnetic enclosure using the base section 312 and the cap section 313, electromagnetic waves to be unnecessarily generated to the chip 311 responding to the light emission can be effectively enclosed at a position close to their generation source. Thereby, derived are effects of sufficiently reducing the emission of any unnecessary electromagnetic waves. If a large current is supplied to the Red LED 101R with the above-described high-speed drive, it becomes possible to reduce the emission of the strong electromagnetic waves to be generated responding to the light emission. Due to such effects that the electromagnetic waves coming from the projector 100 can be reduced, the electromagnetic compatibility can be ensured to put the projector 100 into practical use.

The insulation layer 316 serves to electrically insulate among the base section 312, and the electrode terminals 314 and 315. With such a structure, irrespective of the conductive effects of the base section 312, the electrode terminals 314 and 315 become able to supply currents to the chip 311. In a case of directly connecting the chip 311 and the electrode terminals 314 and 315, the Red LED 101R has such a structure that the chip 311 and the electrode terminals 314 and 315 are electromagnetically enclosed therein.

Once a connection is established between the base section 312 and a member, such as a light source drive circuit, the currents as a result of conversion from the electromagnetic waves can be forwarded to the ground electrode 320 that is externally located. In this case, if the base section 312 is protruding outside of the Red LED 101R, the base section 312 and the member exemplified by a light source drive circuit can be connected together with ease at low impedance. With such a structure, the currents as a result of conversion from the electromagnetic waves can be forwarded to the externally-provided ground electrode 320 with a high degree of efficiency. In the Red LED 101R, instead of the base section 312, the cap section 313 may be structured so as to protrude to the exterior. By protruding the cap section 313 to the exterior, the cap section 313 and the member, such as a light source drive circuit, may be connected together.

By establishing a connection between the base section 312 and the ground electrode 320, the currents as a result of conversion from the electromagnetic waves can be passed to the outside of the Red LED 101R. The currents passed to the ground electrode 320 are eventually converted into Joule heat. As such, by passing the currents as a result of conversion from the electromagnetic waves to the outside of the Red LED 101R, this favorably leads to effects of reducing the emission of any unnecessary electromagnetic waves.

Herein, the Red LED 101R has the structure in which the base section 312 and the ground electrode 320 are connected together. This is surely not restrictive, and the cap section 313 and the ground electrode 320 may be connected together therein. Even with a connection between the cap section 313 and the ground electrode 320, the currents as a result of conversion from the electromagnetic waves can be passed to the exterior of the Red LED 101R.

In a case of attaching the base section 312 and the cap section 313 together for placement, for example, an attachment part A between the base section 312 and the cap section 313 may have a space. If a space is observed in the attachment part A as such, the electromagnetic waves may leak from the space. In consideration thereof, if the light emission of the chip 311 generates electromagnetic waves of a predetermined frequency, the base section 312 and the cap section 313 are placed so as to have a spatial space d (not shown) therebetween, being equal to one twentieth of the wavelength of the electromagnetic waves or shorter. Assuming that the electromagnetic waves to be generated due to the light emission of the chip 311 has the frequency of 14 GHz, the space d is set so as to be about 1 mm or smaller, equal to one twentieth of the wavelength of the electromagnetic waves or shorter. In response to the light emission, LEDs of the current type generate electromagnetic waves having a frequency of about 75 GHz. When the electromagnetic waves have the frequency of 75 GHz, the space d is preferably 200 µm or smaller.

By setting the spatial space d between the base section 312 and the cap section 313 to have one twentieth of the wavelength of any unnecessary electromagnetic waves or shorter, such a structure will lead to leakage reduction of the electromagnetic waves from the space. As such, even if there is a difficulty in closely attaching together the base section 312 and the cap section 313, the electromagnetic waves can be prevented from leaking or such leakage can be reduced through reinforcement of electromagnetic enclosure strength between the chip 311 and the electrode terminals 314 and 315. Specifically for high-frequency electromagnetic waves from LEDs of the current type, their leakage can be effectively reduced or prevented through reinforcement of electromagnetic enclosure.

The Green LED 101G and the Blue LED 101B have a similar structure to the Red LED 101R to reduce the emission of any unnecessary electromagnetic waves. Thus, similarly to the Red LED 101R, the Green LED 101G and the Blue LED 101B can reduce the emission of the unnecessary electromagnetic waves. Accordingly, in the projector 100 in its entirety, the emission of the electromagnetic waves unnecessarily coming from the LEDs 101R, 101G, and 101B for the respective colored light beams can be reduced.

Modified Example

Figure 4:
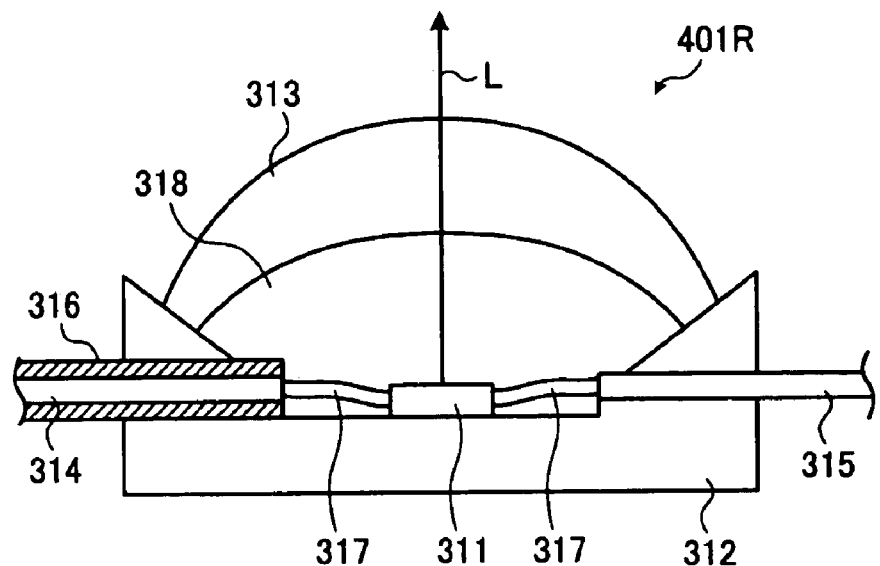
FIG. 4 is a cross-sectional view of a light source unit of a modified example of the first exemplary embodiment.

FIG. 4 shows the cross-sectional structure of a Red LED 401R serving as a light source unit of a modified example of the first exemplary embodiment. The Red LED 401R can be applied to the projector 100. Any part identical to the Red LED 101R of the above first exemplary embodiment is provided with the same reference numeral, and is not described again if already described. The Red LED 401R of the present modified example is provided such that either of two electrode terminals is electrically connected to the base section 312.

For example, the first electrode terminal 314 of the Red LED 401R is insulated from the base section 312 by the insulation layer 316. On the other hand, the second electrode terminal 315 is not provided with the insulation layer 316. Thus, the second electrode terminal 315 is electrically connected to the base section 312. Moreover, unlike the Red LED 101R of the first exemplary embodiment, in the Red LED 401R, no connection is established between the part of the base section 312 protruding outside of the Red LED 401R, and a light source drive circuit, or the like.

Through electrical connection between the second electrode terminal 315 and the base section 312, the currents as a result of conversion from electromagnetic waves by the base section 312 or the cap section 313 are passed from the second electrode terminal 315 to the outside of the Red LED 401R. Herein, when the second electrode terminal 315 is a cathode electrode, the second electrode terminal 315 can be directly connected to a ground electrode that is not shown. Further, when the second electrode terminal 315 is an anode electrode, the second electrode terminal 315 can be connected to the ground electrode that is not shown via an external power supply. As such, through the second electrode terminal 315, an electrical connection can be established in the structure between the base section 312 and the ground electrode.

The electrode terminal for connection with the base section 312 may be either of the electrode terminals 314 and 315. The ground electrode may be provided based on the electrode terminal thus selected for connection with the base section 312 to pass the currents as a result of conversion from the electromagnetic waves to the exterior of the Red LED 401R. As such, by establishing a connection between the base section 312 and either of the electrode terminals 314 and 315, the currents as a result of conversion from the electromagnetic waves can be passed to the ground electrode without newly including a terminal in addition to the two electrode terminals 314 and 315. As such, the following exemplary effects are favorably achieved, with a simple structure, and forwarding the currents as a result of conversion from the electromagnetic waves to the exterior of the Red LED 401R.

[Second Exemplary Embodiment]

Figure 5:
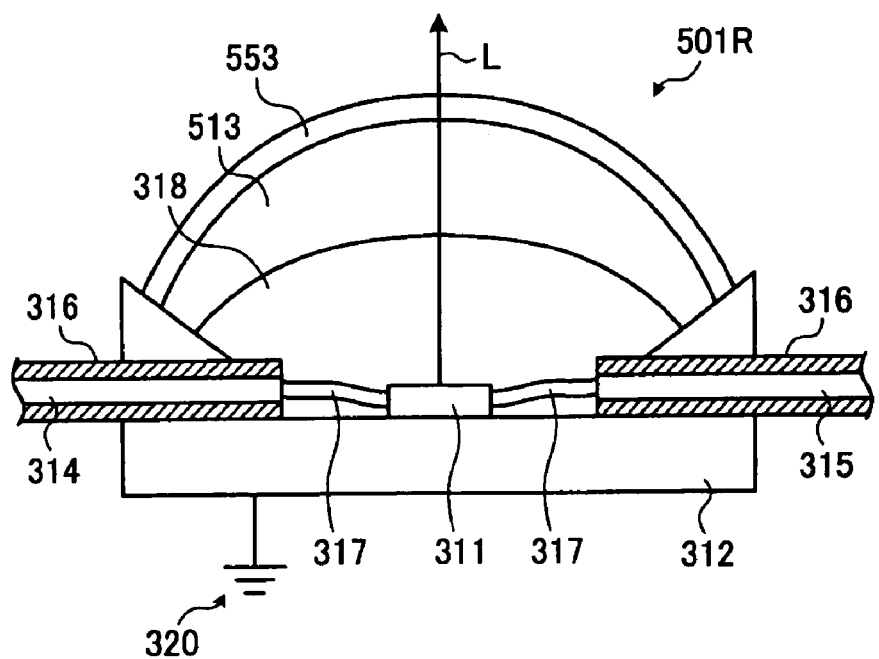
FIG. 5 is a cross-sectional view of a light source unit of a second exemplary embodiment of the present invention.

FIG. 5 shows the cross-sectional structure of a Red LED 501R serving as a light source unit of a second exemplary embodiment of the present invention. The Red LED 501R can be applied to the projector 100 of the above first exemplary embodiment. Any part identical to the above first exemplary embodiment is provided with the same reference numeral, and is not described again if already described. The Red LED 501R of the present exemplary embodiment is provided such that a surface member 553 is provided to the light-emitting side of a cap section 513.

The cap section 513 is made from a transparent member, e.g., transparent resin, that is conventionally popular or popular in the related art for LEDs. The surface member 553 provided to the light-emitting side of the cap section 513 is made from an optically transparent conductive member. The surface member 553 includes, for example, a transparent conductive film formed by evaporating ITO, ZnO, or other materials to the cap section 513. The light beam L from the chip 311 can be extracted to the outside of the Red LED 501R with a high degree of efficiency in accordance with the respective refractive characteristics of the surface member 553, the cap section 513, and the liquid member 318.

Due to the surface member 553, the chip 311, the bonding wire 317, and the electrode terminals 314 and 315 are sealed by the base section 312 and the surface member 553. With such a structure, similarly to the Red LED 101R of the first exemplary embodiment, the base section 312 and the surface member 553 can serve to electromagnetically enclose the chip 311, the bonding wire 317, and the electrode terminals 314 and 315. Since the surface member 553 is optically transparent, it may not be an obstacle for the light beam L from the chip 311. Thereby, the following exemplary effect is successfully achieved, sufficiently reducing the emission of any unnecessary electromagnetic waves.

[Third Exemplary Embodiment]

Figure 6:
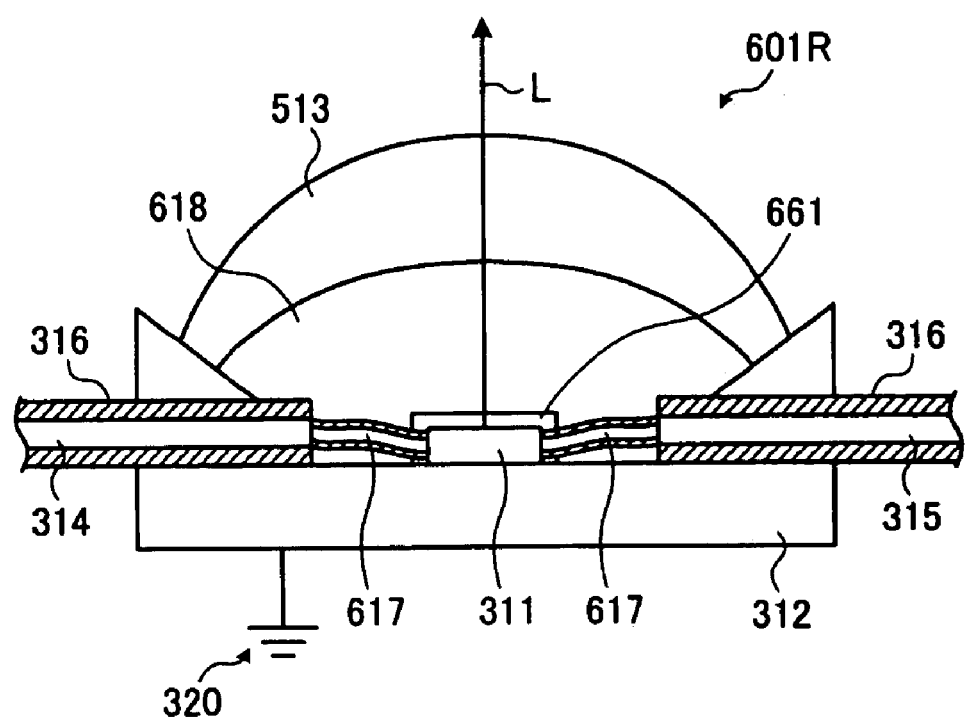
FIG. 6 is a cross-sectional view of a light source unit of a third exemplary embodiment of the present invention.

FIG. 6 shows the cross-sectional structure of a Red LED 601R serving as a light source unit of a third exemplary embodiment of the present invention. The Red LED 601R can be applied to the projector 100 of the above first exemplary embodiment. Any part identical to the first and second exemplary embodiments is provided with the same reference numeral, and is not described again if already described. The Red LED 601R of the present exemplary embodiment includes a conductive liquid member 618. Similarly to the liquid member 318 of the above first exemplary embodiment, the liquid member 618 is filled in a space between the cap section 513 and the base section 312.

The liquid member 618 is an optically transparent conductive member. The liquid member 618 includes a member derived by adding a conductive substance to a liquid member exemplified by transparent silicon gel. Similarly to the liquid member 318 of the above exemplary embodiments, the liquid member 618 causes thermal convection responding to heat coming from the chip 311. By the liquid member 618 causing thermal convection, the Red LED 601R becomes able to release the heat from the chip 311 with a high degree of efficiency. Through combination, as appropriate, of the refractive characteristics of the liquid member 618 and the refractive characteristics of the cap section 513, the light beam L can be efficiently extracted to the exterior of the Red LED 601R.

Between the chip 311 and the liquid member 618, a cover 661 made from an optically transparent insulation member is provided. Due to the cover 661, the chip 311 and the liquid member 618 are electrically insulated from each other. Accordingly, the chip 311 can be driven irrespective of the conductive effects of the liquid member 618. As the cover 661 being optically transparent, it may not be an obstacle for the light beam L coming from the chip 311. Moreover, in the present exemplary embodiment, in addition to the electrode terminals 314 and 315, a bonding wire 617 is also provided with an insulation layer on its surface.

The electrode terminals 314 and 315 are electrically insulated by the insulation layer 316 from the base section 312 and the liquid member 618. Further, the bonding wire 617 and the liquid member 618 are also electrically insulated from each other by an insulation layer. With such a structure, irrespective of the conductive effects of the liquid member 618, the electrode terminals 314 and 315, and the bonding wire 617 become able to supply currents to the chip 311. Herein, the bonding wire 617 is similar to the bonding wire 317 of the above first exemplary embodiment except for the insulation layer provided on its surface.

Due to the liquid member 618, the chip 311, the bonding wire 617, and the electrode terminals 314 and 315 are sealed by the base section 312 and the liquid member 618. With such a structure, similarly to the Red LED 101R of the first exemplary embodiment, the base section 312 and the liquid member 618 can serve to electromagnetically enclose the chip 311, the bonding wire 617, and the electrode terminals 314 and 315. Since the liquid member 618 is optically transparent, it may not be an obstacle for the light beam L coming from the chip 311. Thereby, the following effect is successfully achieved, sufficiently reducing the emission of any unnecessary electromagnetic waves.

Similarly to the cap section 313 of the above first exemplary embodiment, the surface member 553 of the second exemplary embodiment and the liquid member 618 of the third exemplary embodiment are preferably so set that the spatial space d with the base section 312 is equal to one twentieth of the wavelength of the electromagnetic waves or shorter. If set, the electromagnetic waves can be prevented from leaking or such leakage can be reduced. Moreover, in the above exemplary embodiments, a light source unit is exemplified by an LED that is a solid-state light emitting device. Alternatively, other types of solid-state light emitting devices, such as a semiconductor laser device, an electroluminescent (EL) device, or other device may be used. The projector 100 is not restricted to a structure that includes a single transparent liquid crystal display unit, and may have a structure that includes three transparent liquid crystal display units, a structure that includes a reflective liquid crystal display unit, or a structure that uses a tilt mirror device.

[Exemplary Industrial Applicability]

As described in the foregoing, a light source unit of an exemplary embodiment of the present invention can be used as a light source unit for a projector.

What is claimed is:

1. A light source unit, comprising:
a chip that emits light responding to an incoming current;
a base section structured by stacking the chip;
an electrode terminal to supply the current to the chip; and
a cap section made from an optically transparent member to seal both the chip and the electrode terminal;
at least the chip and the electrode terminal being electromagnetically enclosed by a electrically conductive member,
at least the cap section and a part of the base section being made from the electrically conductive member.

2. The light source unit according to claim 1,
at least the chip and the electrode terminal being sealed by at least the part of the base section and the cap section.

3. A light source unit comprising:
a chip that emits light responding to an incoming current;
a base section structured by stacking the chip;
an electrode terminal to supply the current to the chip; and
a cap section made from an optically transparent member to seal both the chip and the electrode terminal;
at least the chip and the electrode terminal being electromagnetically enclosed by a electrically conductive member,
the cap section having a light emitting side provided with an optically transparent surface member,
at least a part of the base section and the surface member being made from the electrically conductive member, and
at least the chip and the electrode terminal being sealed by at least the part of the base section and the surface member.

4. A light source unit comprising:
a chip that emits light responding to an incoming current;
a base section structured by stacking the chip;
an electrode terminal to supply the current to the chip; and
a cap section made from an optically transparent member to seal both the chip and the electrode terminal; and
an optically transparent liquid member being provided between the chip and the cap section,
at least the chip and the electrode terminal being electromagnetically enclosed by a conductive member,
at least a part of the base section and the liquid member being made from the conductive member, and
at least the chip and the electrode terminal being sealed by at least the part of the base section and the liquid member.

5. The light source unit according to claim 1,
the electrode terminal including two electrode terminals, and
either of the two electrode terminals establishing an electrical connection with the electrically conductive member.

6. The light source unit according to claim 1, the electrically conductive member being provided to protrude an exterior.

7. The light source unit according to claim 1,
when an electromagnetic wave of a predetermined frequency is generated responsively when the chip emits light, the base section and the cap section being separated by a space equal to one twentieth of a wavelength of the electromagnetic wave or shorter.

8. The light source unit according to claim 1, the electrically conductive member being electrically connected with a ground electrode.

9. A projector, comprising:
a light source unit to supply a light beam, the light source unit including the light source unit according to claim 1;
a spatial light modulator to modulate the light beam supplied by the light source unit in accordance with a picture signal; and
a projection lens to project the light beam from the spatial light modulator.

* * * * *